US012604129B2

(12) United States Patent
Huang et al.

(10) Patent No.: US 12,604,129 B2
(45) Date of Patent: Apr. 14, 2026

(54) TRUE WIRELESS DEVICE AND DUAL-MODE TRUE WIRELESS DEVICE

(71) Applicant: Fortemedia, Inc., Santa Clara, CA (US)

(72) Inventors: Yen-Son Paul Huang, Santa Clara, CA (US); Shih-Chin Gong, Taipei City (TW)

(73) Assignee: FORTEMEDIA, INC., Alviso, CA (US)

( * ) Notice: Subject to any disclaimer, the term of this patent is extended or adjusted under 35 U.S.C. 154(b) by 726 days.

(21) Appl. No.: 18/063,738

(22) Filed: Dec. 9, 2022

(65) Prior Publication Data

US 2024/0121545 A1 Apr. 11, 2024

Related U.S. Application Data

(60) Provisional application No. 63/378,699, filed on Oct. 7, 2022.

(51) Int. Cl.
| | |
|---|---|
| *H04R 1/10* | (2026.01) |
| *B81B 3/00* | (2006.01) |
| *H04R 1/1025* | (2026.01) |
| *H04R 3/00* | (2006.01) |

(52) U.S. Cl.
CPC ......... *H04R 1/1016* (2013.01); *B81B 3/0021* (2013.01); *H04R 1/1025* (2013.01); *H04R 1/1041* (2013.01); *H04R 3/00* (2013.01); *B81B 2201/0257* (2013.01); *H04R 2201/003* (2013.01); *H04R 2460/17* (2013.01)

(58) Field of Classification Search
CPC .. H04R 1/1016; H04R 1/1025; H04R 1/1041;

H04R 3/00; H04R 3/12; H04R 2201/003; H04R 2420/07; H04R 2460/17; B81B 3/0021; B81B 2201/0257
USPC .......................................................... 381/311
See application file for complete search history.

(56) References Cited

U.S. PATENT DOCUMENTS

| | | |
|---|---|---|
| 11,202,155 B2 | 12/2021 | Rusconi |
| 2018/0367884 A1* | 12/2018 | Murarka .............. H04R 25/554 |
| 2019/0369236 A1 | 12/2019 | Rusconi |

FOREIGN PATENT DOCUMENTS

| | | |
|---|---|---|
| TW | 201924365 A | 6/2019 |
| TW | 202005418 A | 1/2020 |

OTHER PUBLICATIONS

Chinese language office action dated Mar. 28, 2024, issued in application No. TW 112114661.

* cited by examiner

*Primary Examiner* — Paul Kim

(74) *Attorney, Agent, or Firm* — McClure, Qualey & Rodack, LLP

(57) ABSTRACT

A true wireless device is provided. The true wireless device includes a modulator for generating ultrasonic waves and a MEMS speaker coupled to the modulator. The MEMS speaker provides greater bandwidth than traditional speakers such as electrodynamic speakers and piezoelectric thin-film speakers. In particular, the MEMS speaker has an audio frequency band and an ultrasonic frequency band.

7 Claims, 11 Drawing Sheets

100 sound
waves

200

300

100 sound
waves

800

600 on/off

700

500

TRUE WIRELESS DEVICE AND DUAL-MODE TRUE WIRELESS DEVICE

CROSS REFERENCE TO RELATED APPLICATIONS

This application claims the benefit of U.S. Provisional Application No. 63/378,699, filed on Oct. 7, 2022, the entirety of which is incorporated by reference herein.

BACKGROUND OF THE INVENTION

Field of the Invention

The present disclosure relates to a true wireless device.

Description of the Related Art

As technology has developed, true wireless devices have been used widely, for example, to listen to music and other audio, to answer telephone calls, to make telephone calls, etc. Typically, true wireless devices include a pair of earbuds. If a user wants to perform one of the aforementioned activities using an existing true wireless device, earbuds must be inserted into the user's ears, because audible sound waves can only travel small distances. However, some users may want to use their true wireless devices even when they are not wearing their earbuds. Therefore, a true wireless device that can be used even when the earbuds are not being worn is provided.

BRIEF SUMMARY OF THE INVENTION

Some embodiments of the present disclosure provide a true wireless device. The true wireless device includes a modulator for generating ultrasonic waves and a MEMS speaker coupled to the modulator. The MEMS speaker has an audio frequency band and an ultrasonic frequency band.

In some embodiments, the true wireless device further includes an earbud and/or an earbud case. In some embodiments, the modulator and the MEMS speaker are disposed in the earbud. In some embodiments, the modulator and the MEMS speaker are disposed in the earbud case. In some embodiments, the modulator is disposed in the earbud, and the MEMS speaker is disposed in the earbud case. In some embodiments, the MEMS speaker is disposed in the earbud, and the modulator is disposed in the earbud case.

In some embodiments, the true wireless device further includes a controller configured to control whether or not the modulator generates ultrasonic waves. In some embodiments, the true wireless device further includes a sensing element for sensing whether or not the earbud is inserted into an ear, when the earbud is not inserted into the ear, the modulator generates ultrasonic waves according to a signal generated by the controller. In some embodiments, the true wireless device further includes a sensing element for sensing a distance between the earbud and the earbud case, when the distance is less than a predetermined value, the modulator generates ultrasonic waves according to a signal generated by the controller. In some embodiments, the predetermined value is 50 cm. In some embodiments, the predetermined value is 30 cm.

Some embodiments of the present disclosure provide a dual-mode true wireless device having a normal mode and a directional-speaker mode. The dual-mode true wireless device includes a modulator and a MEMS speaker coupled to the modulator. The MEMS speaker has an audio frequency band and an ultrasonic frequency band. The modulator does not generate ultrasonic waves in the normal mode, and the modulator generates ultrasonic waves in the directional-speaker mode.

In some embodiments, the dual-mode true wireless device further includes a first earbud and a second earbud, when at least one of the first earbud and the second earbud is inserted into an ear, the dual-mode true wireless device is in the normal mode. In some embodiments, when neither the first earbud nor the second earbud is inserted into an ear, the dual-mode true wireless device is in the directional-speaker mode.

In some embodiments, the dual-mode true wireless device further includes an earbud case, when a distance between the first earbud and the earbud case or a distance between the second earbud and the earbud case is greater than a predetermined value, the dual-mode true wireless device is in the normal mode. In some embodiments, when a distance between the first earbud and the earbud case and a distance between the second earbud and the earbud case is less than a predetermined value, the dual-mode true wireless device is in the directional-speaker mode. In some embodiments, the predetermined value is 50 cm. In some embodiments, the predetermined value is 30 cm.

BRIEF DESCRIPTION OF THE DRAWINGS

The present disclosure can be more fully understood by reading the detailed description and examples with references made to the accompanying drawings. It should be noted that various features may be not drawn to scale. In fact, the dimensions of the various features may be arbitrarily increased or decreased for clarity of discussion, and the various features may be drawn schematically.

DETAILED DESCRIPTION OF THE INVENTION

The following description provides many different embodiments, or examples, for implementing different features of the present disclosure. Ordinal terms such as "first", "second", etc., used in the description and claims do not by themselves connote any priority, precedence, or order of one element over another, but are used merely as labels to distinguish one element from another element having the same name. Therefore, a first element in the description may be referred to as a second element in the claims. In addition, in different examples of this disclosure, similar and/or corresponding symbols may be used repeatedly. These similar and/or corresponding symbols or alphabets are used for the sake of clear description of some embodiments of the present application, and they do not dictate any relationship between different embodiments and/or structures.

Spatially relative terms, such as "above" and the like, may be used herein for ease of description to describe one element or feature's relationship to another element or feature as illustrated in figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. If a device of the drawings is flipped upside down, an element that is "above" will become an element that is "below".

In this specification, the words "including", "comprising", "having", and the like should be interpreted as meaning "including but not limited to . . . ". Therefore, when the words "including", "comprising", "having", and the like are used in the description of this disclosure, the presence of corresponding features, regions, steps, operations and/or components is specified, and without excluding the presence of one or more other features, regions, steps, operations and/or components. In addition, deviation between any two numerical values or directions may exist.

Figure 1:
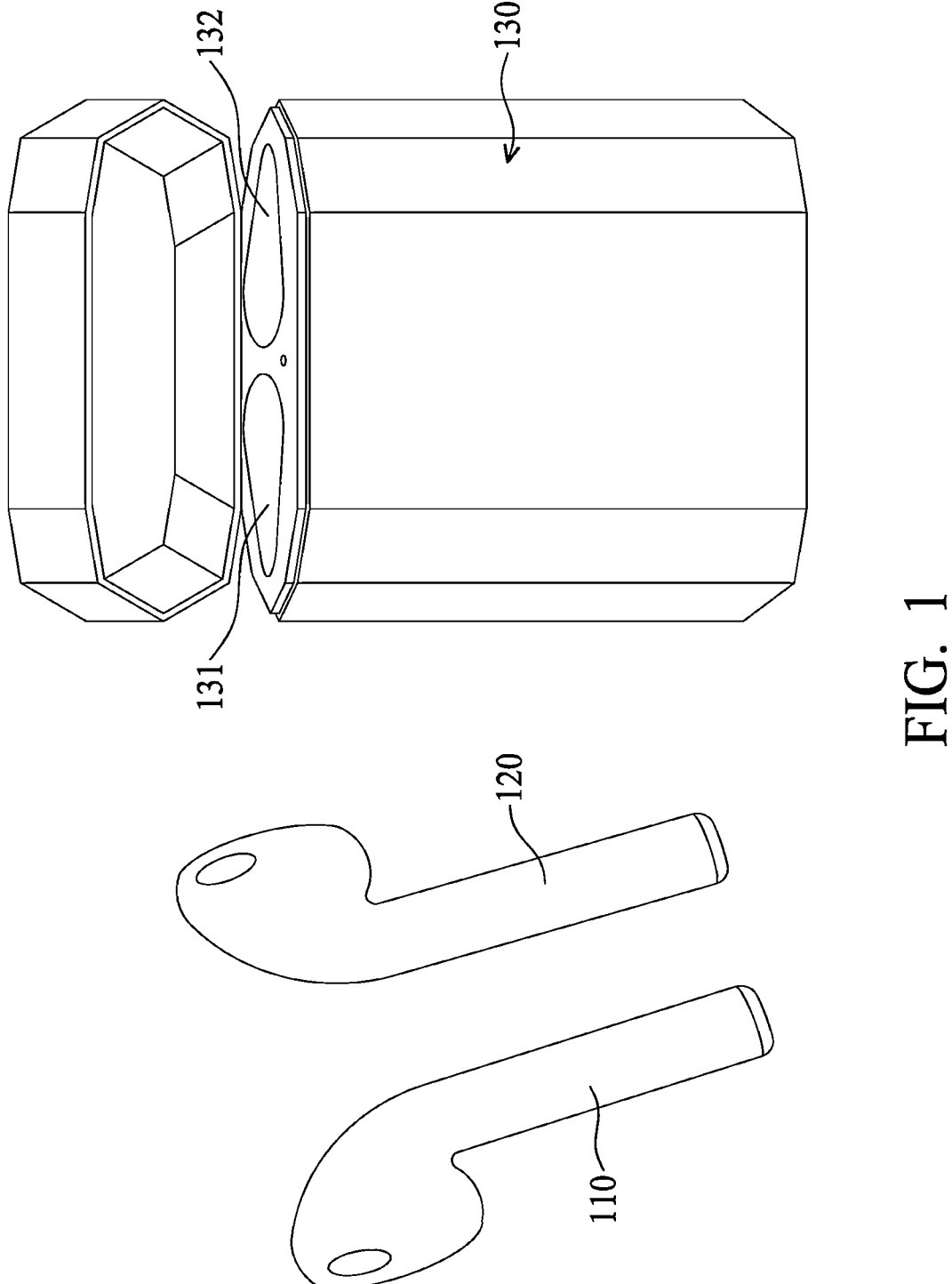
FIG. 1 illustrates a true wireless device, in accordance with some embodiments.

FIG. 1 illustrates a true wireless device 100, in accordance with some embodiments. In this embodiment, the true wireless device 100 includes a first earbud 110, a second earbud 120, and an earbud case 130. The earbud case 130 may include a first accommodating space 131 and a second accommodating space 132 for accommodating the first earbud 110 and the second earbud 120, respectively. In some embodiments, the true wireless device 100 may be connected to an electronic device (not shown, such as a smartphone) by a wireless connection, such as a Bluetooth connection. Therefore, the audible sound waves from the electronic device may be sent to the first earbud 110 and the second earbud 120.

Figure 2:
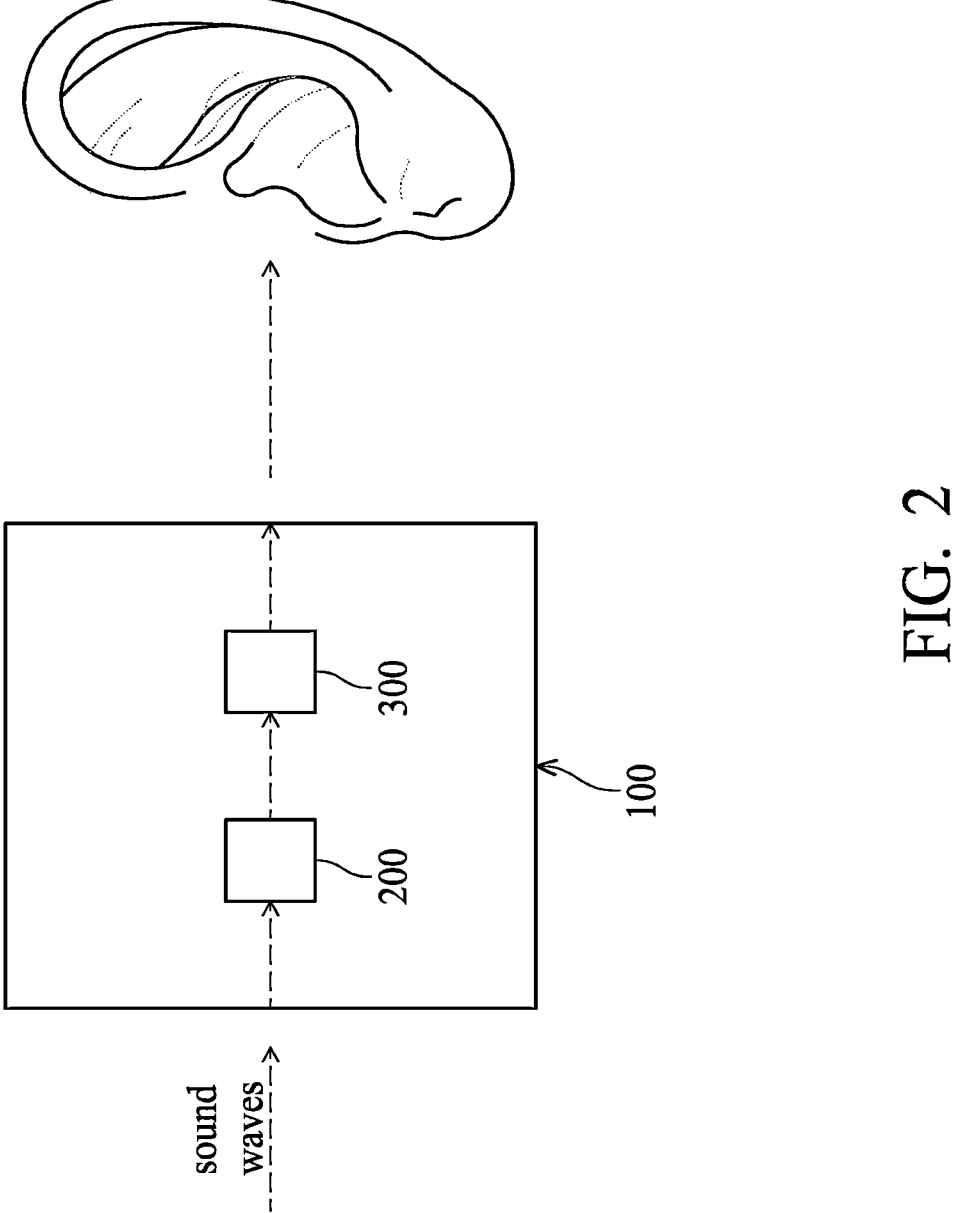
FIG. 2 illustrates how sound waves enter the user's ears via the true wireless device, in accordance with some embodiments.

In the present disclosure, the true wireless device 100 can be used even when the first earbud 110 and the second earbud 120 are not being worn in the ears. Please refer to FIG. 2 for further details. FIG. 2 illustrates how sound waves enter the user's ears via the true wireless device 100, in accordance with some embodiments. For ease of illustration, the true wireless device 100 is illustrated schematically. The true wireless device 100 includes a modulator 200 and a microelectromechanical systems (MEMS) speaker 300. The modulator 200 is able to generate ultrasonic waves. The MEMS speaker 300 is coupled to the modulator 200. Compared to traditional speakers such as electrodynamic speakers and piezoelectric thin-film speakers, the MEMS speaker 300 has a faster response time and better total harmonic distortion, is thinner and lighter, and provides greater bandwidth. In particular, the MEMS speaker 300 has an audio frequency band and an ultrasonic frequency band. Therefore, there is no need for two speakers with different bandwidths.

Ultrasonic waves have higher frequencies (i.e., >20 kHz), and thus ultrasonic waves can travel greater distances with less diffraction and less loss of energy. The ultrasonic waves generated by the modulator 200 are used to reproduce audible sound waves that enter the true wireless device 100. In detail, after audible sound waves enter the true wireless device 100, the ultrasonic waves generated by the modulator 200 are used as carrier waves to modulate the audible sound waves. After the modulated audible sound waves exit the true wireless device 100 and encounter an object (e.g., the user's ear), the modulated audible sound waves may demodulate, and the original audible sound can be heard. In addition, during the transmission of modulated audible sound waves, the modulated audible sound waves are confined within a straight beam because of the ultrasonic waves, so the true wireless device 100 may be used as a directional speaker, for the user's comfort and privacy. Therefore, users may listen to music, listen to other audio, answer a call, make a call, and perform similar tasks without needing to have the earbuds in their ears. In some embodiments, the distance between the true wireless device 100 and the user may be greater than 0.5 m. In some embodiments, the distance between the true wireless device 100 and the user may be greater than 1.0 m. In some embodiments, the distance between the true wireless device 100 and the user may be greater than 2.0 m.

Figure 3:
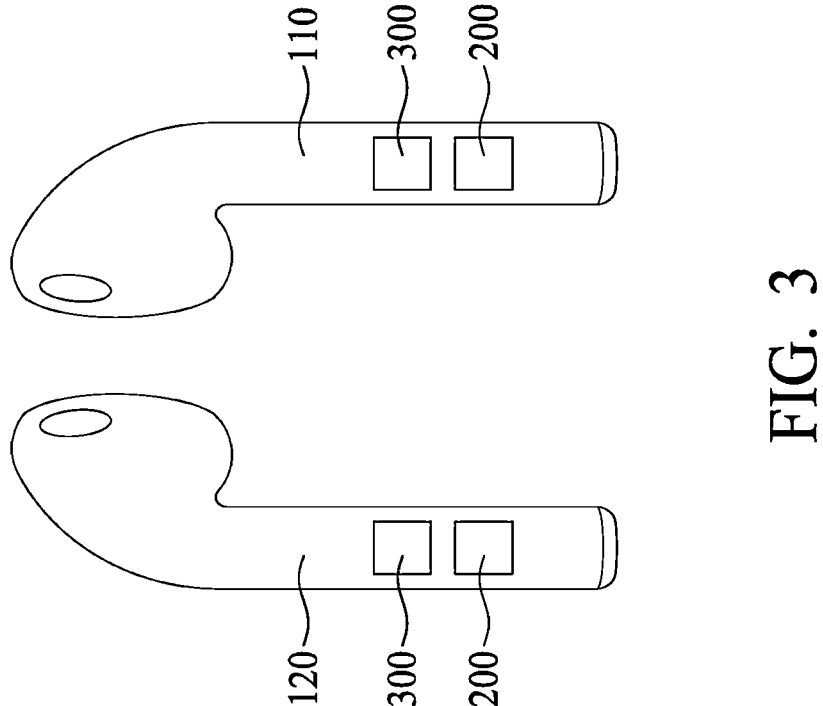
FIG. 3 to FIG. 6 illustrate different configurations of the modulator and the MEMS speaker, in accordance with some embodiments.
Figure 4:
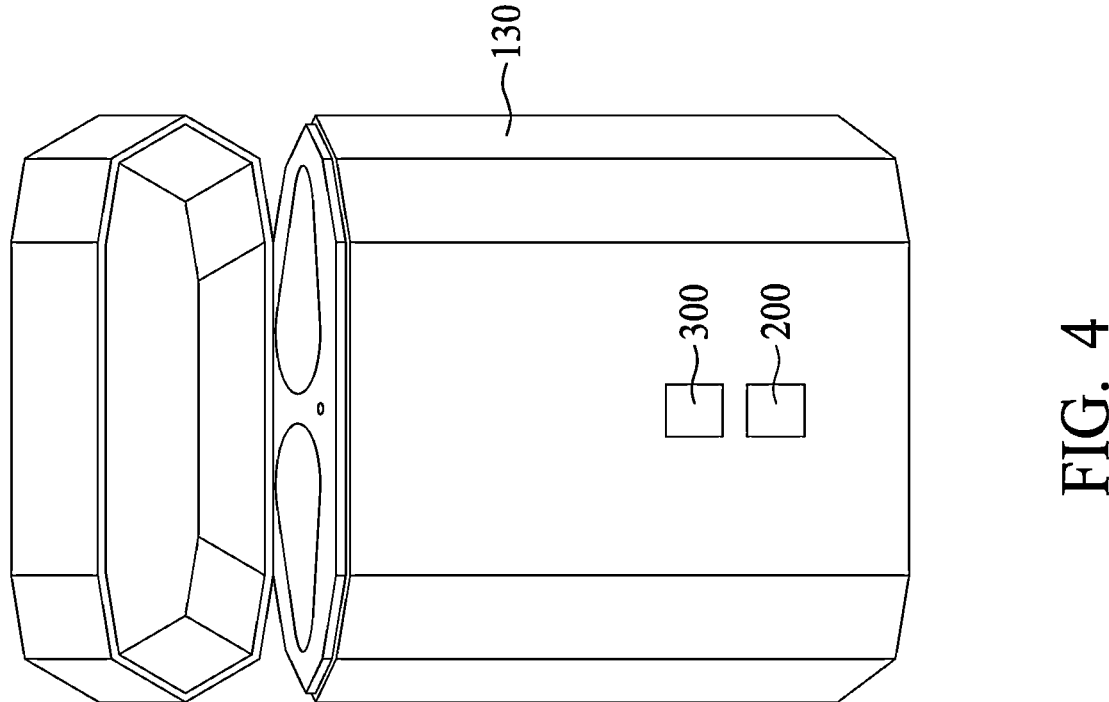
Figure 5:
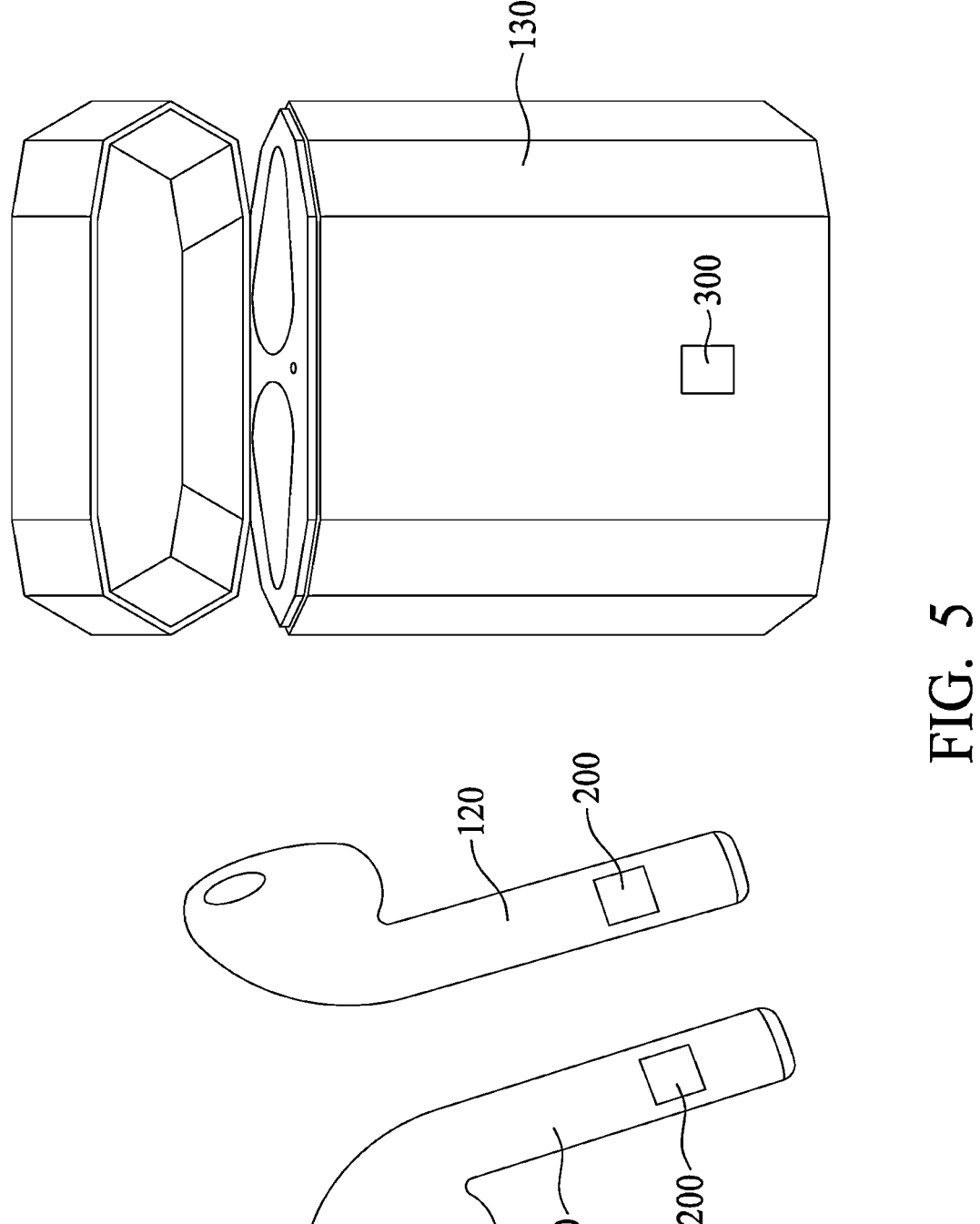
Figure 6:
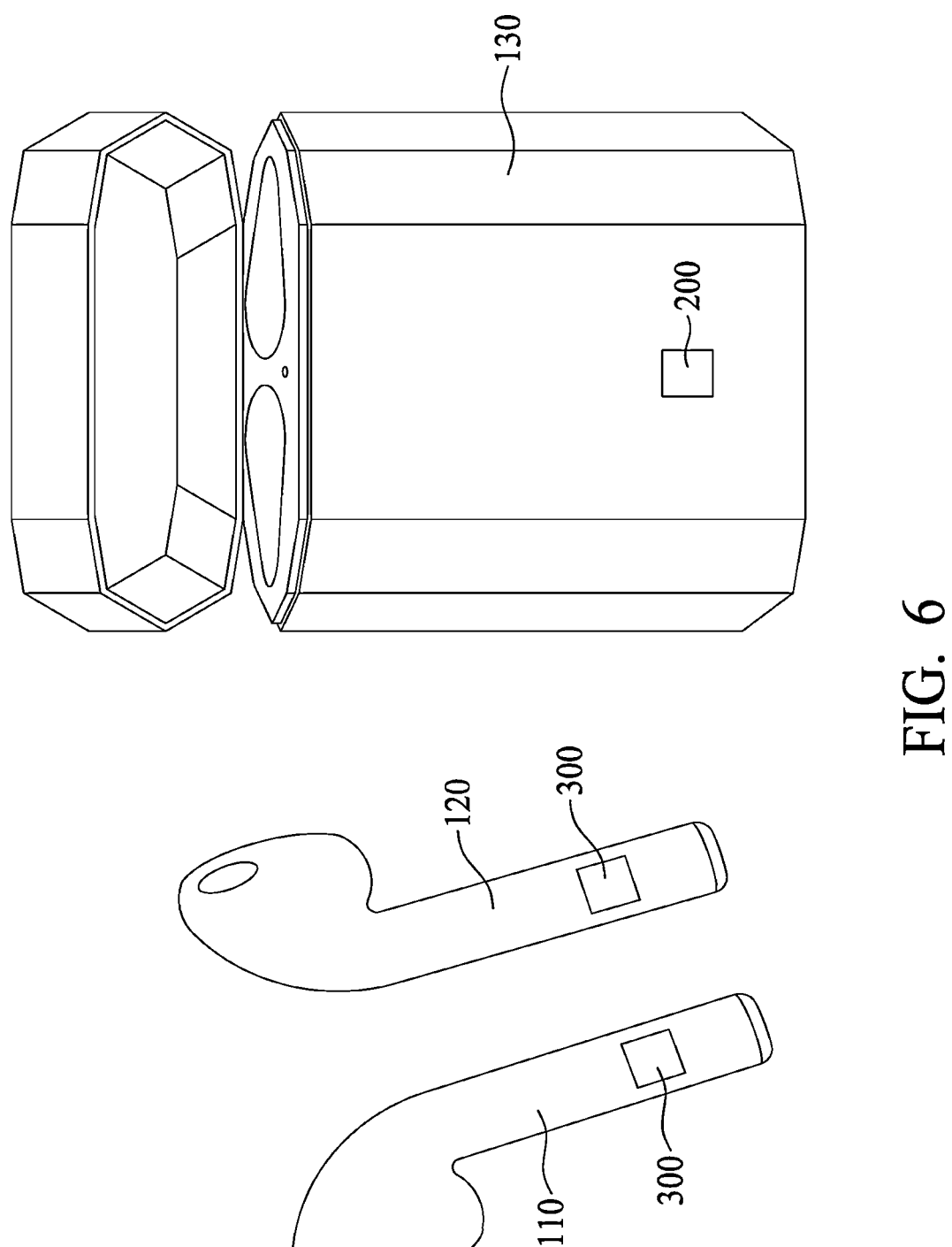

Next, please refer to FIG. 3 to FIG. 6. FIG. 3 to FIG. 6 illustrate different configurations of the modulator 200 and the MEMS speaker 300, in accordance with some embodiments. As shown in FIG. 3, in some embodiments, the modulator 200 and the MEMS speaker 300 are both disposed in the first earbud 110 and the second earbud 120. As shown in FIG. 4, in some embodiments, the modulator 200 and the MEMS speaker 300 are both disposed in the earbud case 130. As shown in FIG. 5, the modulator 200 is disposed in the first earbud 110 and the second earbud 120, and the MEMS speaker 300 is disposed in the earbud case 130. As shown in FIG. 6, the modulator 200 is disposed in the earbud case 130, and the MEMS speaker 300 is disposed in the first earbud 110 and the second earbud 120.

Configurations of the modulator 200 and the MEMS speaker 300 may be determined based on practical needs. For example, in the embodiments where the modulator 200 and the MEMS speaker 300 are both disposed in the earbud case 130, a user can just buy a new earbud case 130 without having to buy another first earbud 110 and another second earbud 120, thereby saving money.

Figure 7:
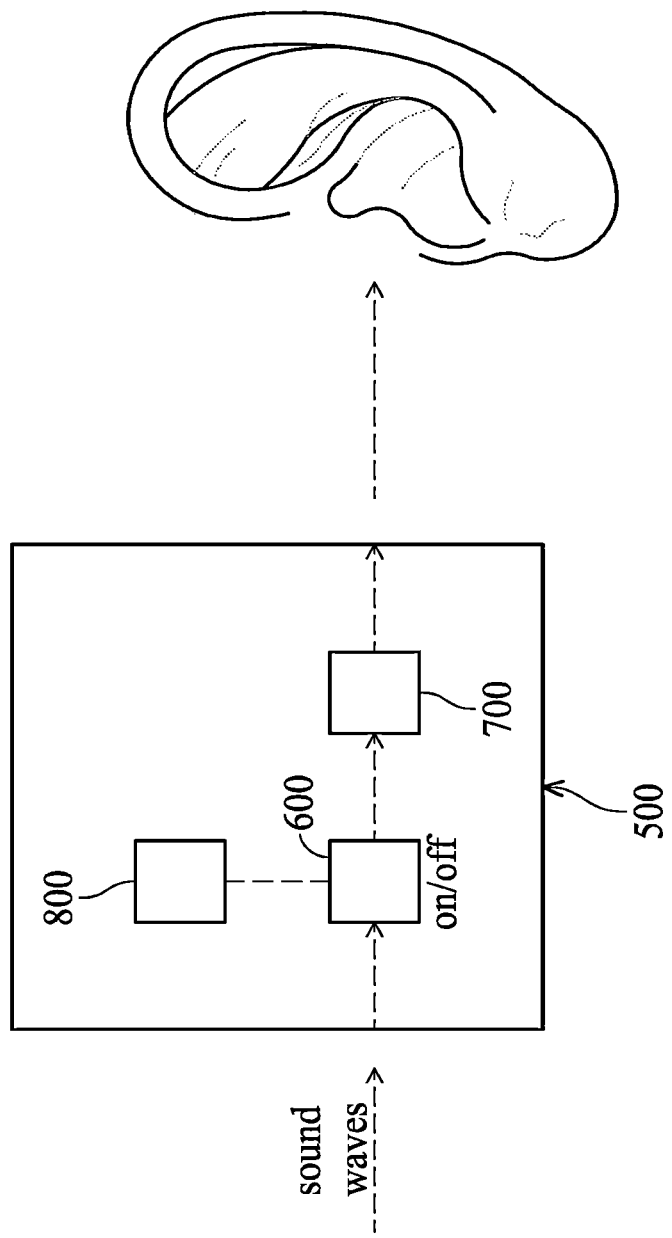
FIG. 7 illustrates how sound waves enter the user's ears via a dual-mode true wireless device, in accordance with some embodiments.

Next, please refer to FIG. 7, which illustrates how sound waves enter the user's ears via a dual-mode true wireless device 500, in accordance with some embodiments. The dual-mode true wireless device 500 includes a modulator 600 and a MEMS speaker 700. The modulator 600 may be substantially the same as the modulator 200, and the MEMS speaker 700 may be substantially the same as the MEMS speaker 300. The dual-mode true wireless device 500 has a normal mode and a directional-speaker mode. In the normal mode, the modulator 600 is turned off, so the modulator 600 does not generate ultrasonic waves, allowing the dual-mode true wireless device 500 to function as a traditional true wireless device. In the directional-speaker mode, the modulator 600 is turned on, so the modulator generates ultrasonic waves, and the dual-mode true wireless device 500 functions as a directional speaker. In some embodiments, switching between the normal mode and the directional-speaker mode is determined by a controller 800. That is, the controller 800 may be configured to control whether or not the modulator 600 generates ultrasonic waves.

Figure 8A:
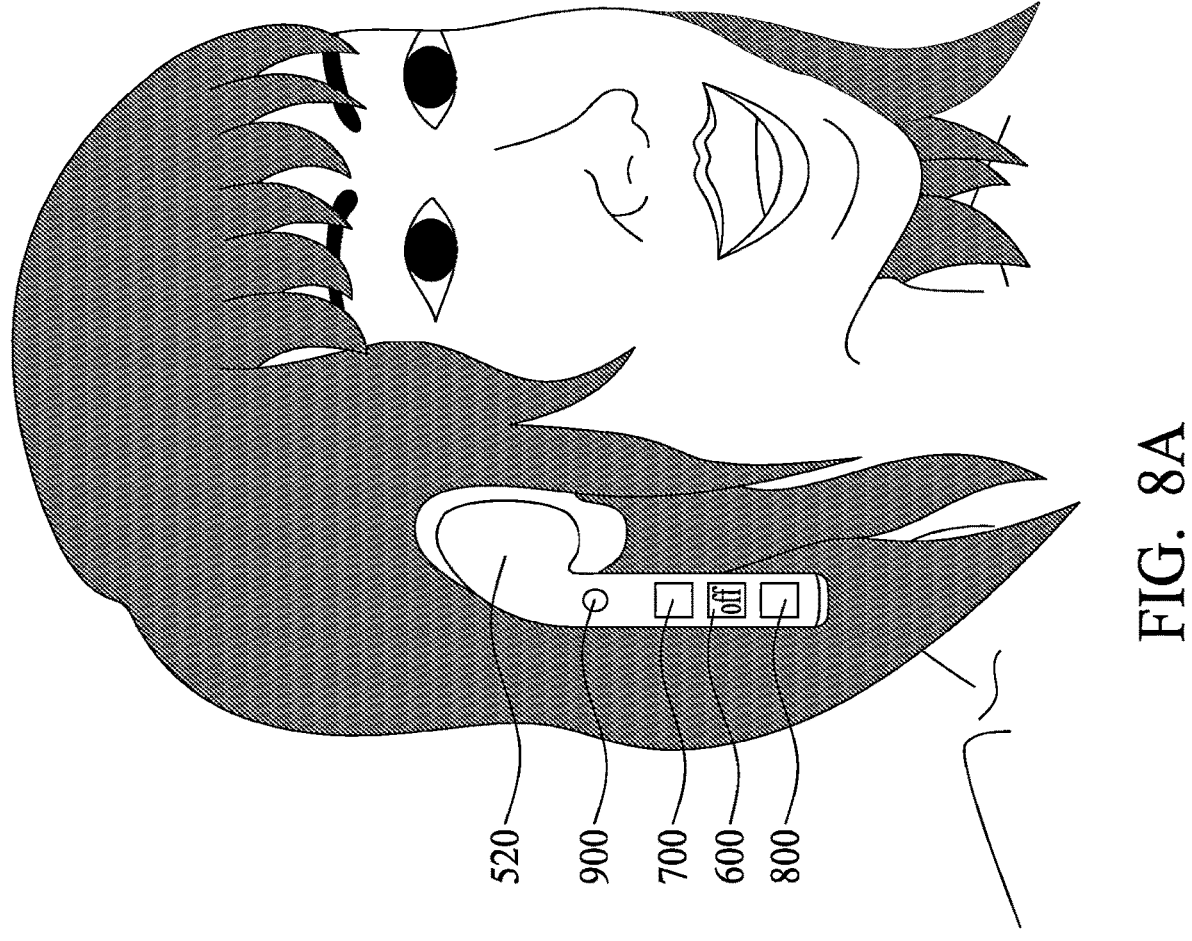
FIG. 8A and FIG. 8B illustrate switching between the normal mode and the directional-speaker mode of the dual-mode true wireless device, in accordance with some embodiments.
Figure 8B:
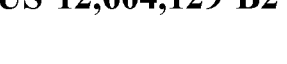

Please refer to FIG. 8A and FIG. 8B, which illustrate switching between the normal mode and the directional-speaker mode of the dual-mode true wireless device 500, in accordance with some embodiments. The dual-mode true wireless device 500 includes a first earbud 510 and a second earbud 520. In this embodiment, the modulator 600 and the MEMS speaker 700 are both disposed in the first earbud 510 and the second earbud 520, but the configuration of the modulator 600 and the MEMS speaker 700 is not limited thereto. As shown in FIG. 8A, when at least one of the earbuds (i.e., the first earbud 510 and the second earbud 520) is inserted into the user's ear, the dual-mode true wireless device 500 is in the normal mode. As shown in FIG. 8B, when neither the first earbud 510 nor the second earbud 520 is inserted into the user's ear, the dual-mode true wireless device 500 is in the directional-speaker mode. In short, in the embodiments illustrated in FIG. 8A and FIG. 8B, switching between the normal mode and the directional-speaker mode of the dual-mode true wireless device 500 is determined by whether or not the user is wearing the first earbud 510 and the second earbud 520.

In some embodiments, the dual-mode true wireless device 500 may include a sensing element 900 for sensing whether or not either of the earbuds (i.e., the first earbud 510 and the second earbud 520) has been inserted into the ear. In some embodiments, the sensing element 900 is electrically connected to the controller 800 to send information about whether or not the user wears the first earbud 510 and the second earbud 520. For example, when the sensing element 900 detects that neither the first earbud 510 nor the second earbud 520 has been inserted into the user's ear, the modulator 600 is turned on to generate ultrasonic waves according to the signal generated by the controller 800.

Figure 9A:
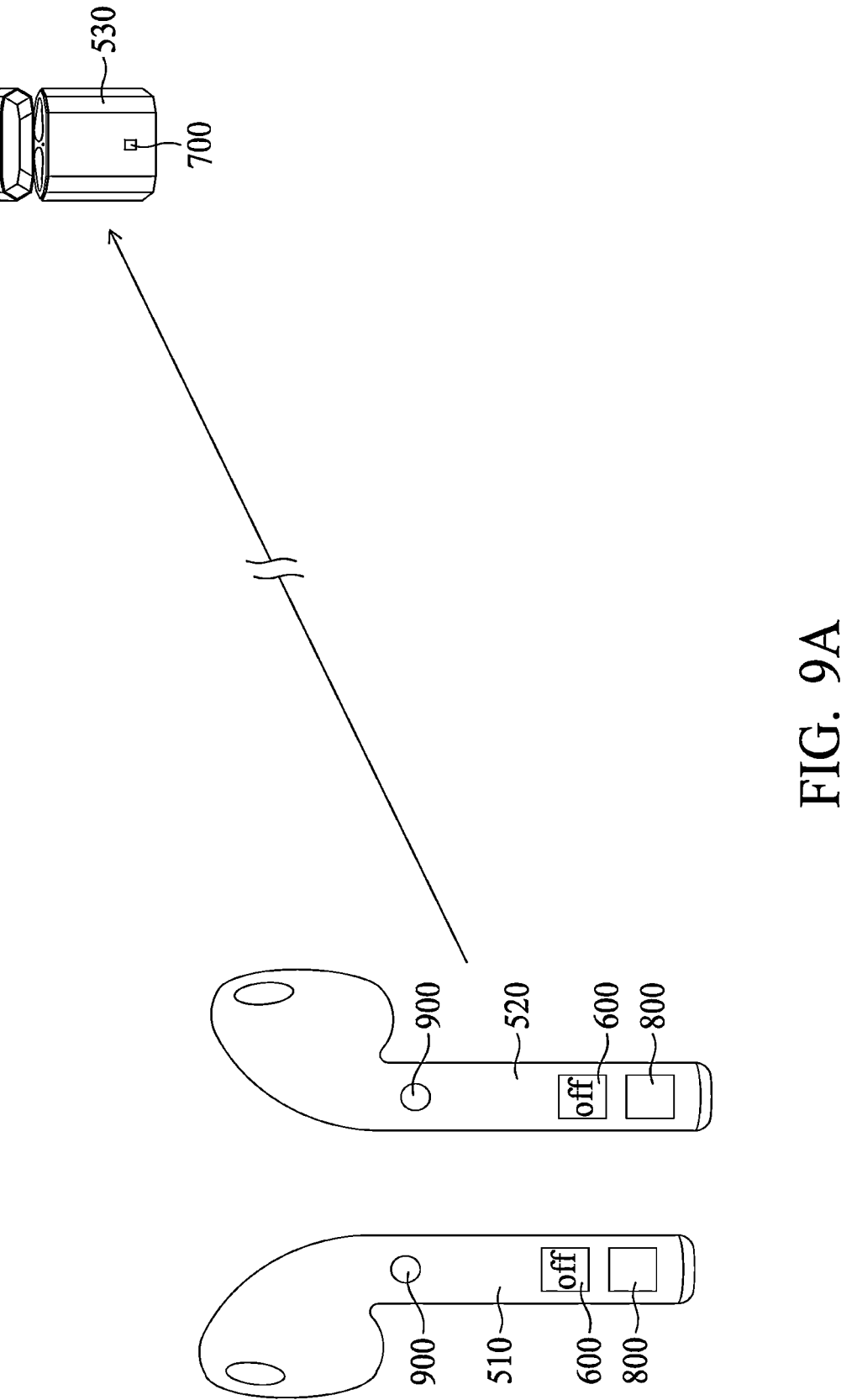
FIG. 9A and FIG. 9B illustrate switching between the normal mode and the directional-speaker mode of the dual-mode true wireless device, in accordance with some embodiments.
Figure 9B:
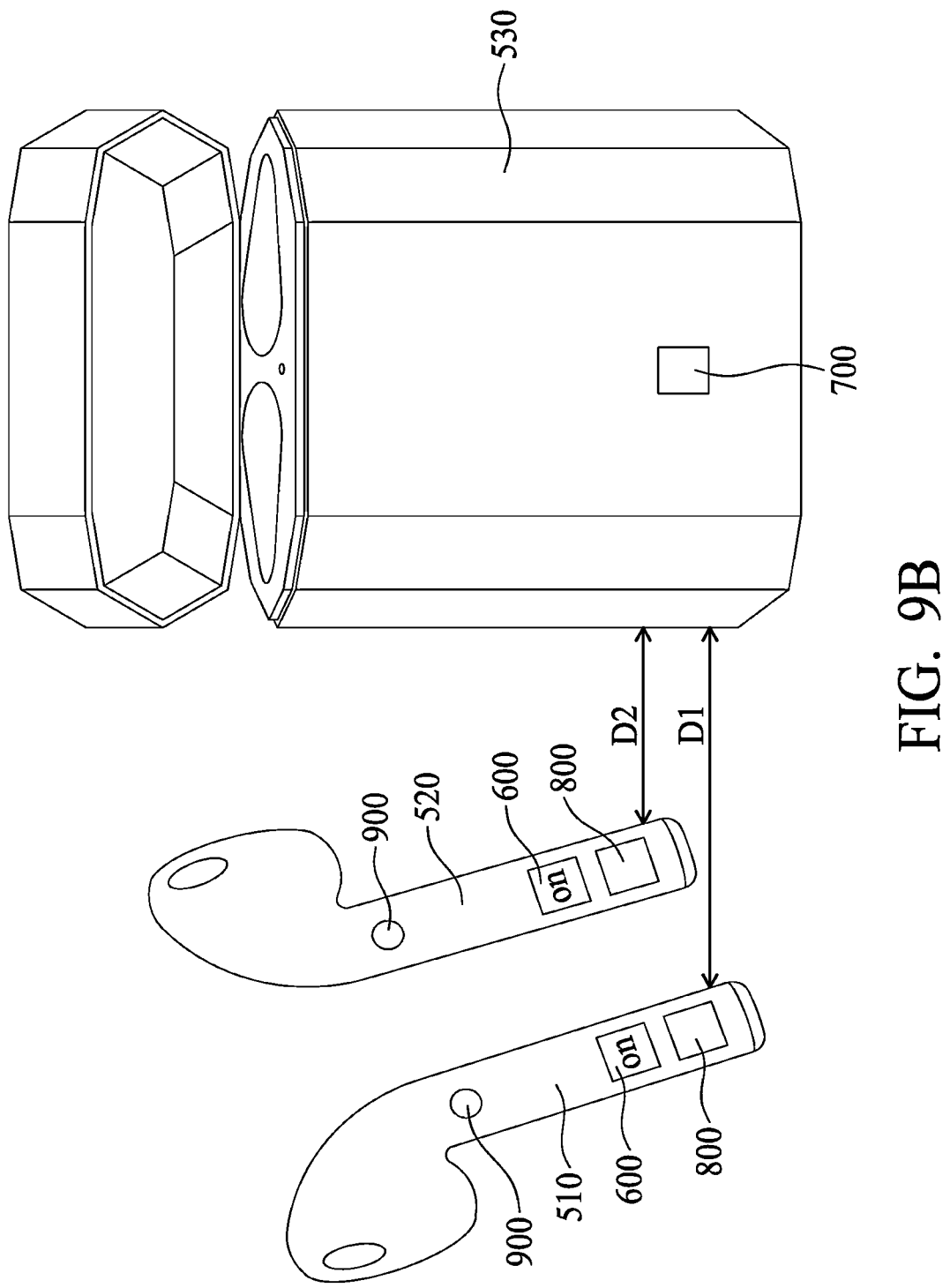

Please refer to FIG. 9A and FIG. 9B, which illustrate switching between the normal mode and the directional-speaker mode of the dual-mode true wireless device 500, in accordance with some embodiments. The dual-mode true wireless device 500 includes an earbud case 530. In this embodiment, the modulator 600 is disposed in the first earbud 510 and the second earbud 520, and the MEMS speaker 700 is disposed in the earbud case 530, but the configuration of the modulator 600 and the MEMS speaker 700 is not limited thereto. As shown in FIG. 9A, when the first earbud 510 and the second earbud 520 are relatively far away from the earbud case 530, the dual-mode true wireless device 500 is in the normal mode. As shown in FIG. 9B, when the first earbud 510 and the second earbud 520 are relatively close to the earbud case 530, the dual-mode true wireless device 500 is in the directional-speaker mode. In short, in the embodiments illustrated in FIG. 9A and FIG. 9B, switching between the normal mode and the directional-speaker mode of the dual-mode true wireless device 500 is determined by the distance between the earbuds 510 and 520 and the earbud case 530.

In some embodiments, the dual-mode true wireless device 500 may include a sensing element 900 for sensing the distance between the earbuds 510 and 520 and the earbud case 530. In some embodiments, when the distance is greater than a predetermined value, the dual-mode true wireless device 500 is in the normal mode, and when the distance is less than the predetermined value, the dual-mode true wireless device 500 is in the directional-speaker mode. In some embodiments, the predetermined value is 50 cm. In some embodiments, the predetermined value is 30 cm. In some embodiments, the sensing element 900 is electrically connected to the controller 800 to send information about the distance D1 between the first earbud 510 and the earbud case 530 and the distance D2 between the second earbud 520 and the earbud case 530. For example, when the sensing element 900 detects that both the distances D1 and D2 are less than the predetermined value, the modulator 600 is turned on to generate ultrasonic waves according to the signal generated by the controller 800. It should be noted that users can adjust the predetermined value to suit their preference.

In some embodiments, the sensing element 900 may be omitted, and there may be a button on the dual-mode true wireless device 500. Users can press the button to change the mode of the dual-mode true wireless device 500 to meet their needs.

As described above, a true wireless device with a modulator and the MEMS speaker is provided. The true wireless device may include earbuds and an earbud case. Due to the modulator and the MEMS speaker, the true wireless device can be used even when the earbuds are not being worn. In addition, the true wireless device may be used as a directional speaker, for the user's comfort and privacy. In addition, a dual-mode true wireless device is provided. The dual-mode true wireless device includes a normal mode and a directional-speaker mode. There are different reasons why it may be necessary to switch between the two modes, for example, whether or not the earbuds are being worn, and the distance between the earbuds and earbud case.

The foregoing outlines features of several embodiments, so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and the combination of various claims and embodiments are within the scope of the disclosure.

What is claimed is:

1. A dual-mode true wireless device having a normal mode and a directional-speaker mode comprising:

a modulator; and a microelectromechanical system (MEMS) speaker coupled to the modulator, wherein the MEMS speaker has an audio frequency band and an ultrasonic frequency band, wherein the modulator does not generate ultrasonic waves in the normal mode, and the modulator generates ultrasonic waves in the directional-speaker mode.

2. The dual-mode true wireless device as claimed in claim 1, further comprising a first earbud and a second earbud, wherein when at least one of the first earbud and the second earbud is inserted into an ear, the dual-mode true wireless device is in the normal mode.

3. The dual-mode true wireless device as claimed in claim 1, further comprising a first earbud and a second earbud, wherein when neither the first earbud nor the second earbud is inserted into an ear, the dual-mode true wireless device is in the directional-speaker mode.

4. The dual-mode true wireless device as claimed in claim 1, further comprising a first earbud, a second earbud, and an earbud case, wherein when a distance between the first earbud and the earbud case or a distance between the second earbud and the earbud case is greater than a predetermined value, the dual-mode true wireless device is in the normal mode.

5. The dual-mode true wireless device as claimed in claim 1, further comprising a first earbud, a second earbud, and an earbud case, wherein when a distance between the first earbud and the earbud case and a distance between the second earbud and the earbud case is less than a predetermined value, the dual-mode true wireless device is in the directional-speaker mode.

6. The dual-mode true wireless device as claimed in claim 5, wherein the predetermined value is 50 cm.

7. The dual-mode true wireless device as claimed in claim 5, wherein the predetermined value is 30 cm.

* * * * *